(12) United States Patent
Song et al.

(10) Patent No.: US 8,703,510 B2
(45) Date of Patent: Apr. 22, 2014

(54) ARRAY SUBSTRATE AND A MANUFACTURING METHOD THEREOF

(75) Inventors: Youngsuk Song, Beijing (CN); Seungjin Choi, Beijing (CN); Seongyeol Yoo, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 113 days.

(21) Appl. No.: 13/278,360

(22) Filed: Oct. 21, 2011

(65) Prior Publication Data

US 2012/0119232 A1    May 17, 2012

(30) Foreign Application Priority Data

Oct. 22, 2010  (CN) .......................... 2010 1 0523144

(51) Int. Cl.
  *H01L 21/00* (2006.01)
  *H01L 21/84* (2006.01)
  *H01L 21/331* (2006.01)
  *H01L 21/8222* (2006.01)

(52) U.S. Cl.
  USPC ............... 438/22; 438/149; 438/151; 438/48; 438/311

(58) Field of Classification Search
  USPC ......... 438/151, 149, 22, 24, 46, 47, 479, 517, 438/153, 154, 128, 48, 157, 283, 311
  See application file for complete search history.

(56) References Cited

U.S. PATENT DOCUMENTS

2009/0290083 A1*  11/2009  Lim et al. .......................... 349/46
2010/0075450 A1*   3/2010  Choi et al. ....................... 438/30

OTHER PUBLICATIONS

First Chinese Office Action dated Jul. 3, 2013; Appln. No. 2010105231447.

* cited by examiner

*Primary Examiner* — Chuong A. Luu
(74) *Attorney, Agent, or Firm* — Ladas & Parry LLP

(57) ABSTRACT

An embodiment of the invention provides a method for manufacturing an array substrate, wherein the procedure for forming a data line, an active layer with a channel, a source electrode, a drain electrode and a pixel electrode comprises applying a photoresist on a data line metal thin film and performing exposure and development processes by using a multi-tone mask so as to form a photoresist pattern including a third thickness region, a second thickness region and a first thickness region whose thicknesses are successively increased, the third thickness region at least corresponding to the pixel electrode, the second thickness region corresponding to the data line, the active layer, the source electrode and the drain electrode, and the first thickness region corresponding to the other regions.

16 Claims, 17 Drawing Sheets 21　4　1 23 31 32 22 21 3　22 21

ARRAY SUBSTRATE AND A MANUFACTURING METHOD THEREOF

BACKGROUND

Embodiments of the present invention relate to an array substrate and a manufacturing method thereof.

Liquid crystal displays are widely used in the field of today's flat panel display. Thin film transistor liquid crystal display (TFT-LCD) is a mainstream liquid crystal display.

The liquid panel of a liquid crystal display comprises an array substrate and a color filter substrate which are bonded with each other, wherein the array substrate typically comprises a base substrate. Horizontally aligned gate lines and vertically aligned data lines are crossed with each other on the base substrate. The data lines and the gate lines define a plurality of pixel units in each of which a TFT switch and a pixel electrode are provided. A TFT switch comprises a gate electrode connected to a gate line, a source electrode connected to a data line, a drain electrode connected to a pixel electrode and an active layer formed between the source electrode, the drain electrode and the gate electrode. In order to insulate adjacent layers, a gate insulation layer is provided on the gate line and the gate electrode; a passivation layer is provided on the data line, the source electrode, the drain electrode and the active layer; the pixel electrodes formed on the passivation layer is electrically connected to the drain electrode by a drain electrode via hole. In addition to the pixel region comprising the pixel cells, there is an interface region around the pixel region on the array substrate. Data line interface via holes and gate line interface via holes are formed in the interface region, so as to expose the date lines and the gate lines and then connect them to a driving circuit.

The various conductive patterns and via holes mentioned above are commonly formed by patterning processes with masks. Five or four patterning processes are needed to fabricate various patterns in the existing technology. It is know that less manufacturing steps can decrease the manufacturing facilities, improve the efficiency and reduce the cost. Therefore, how to simplify the procedure is one of the main research points on the liquid crystal display.

SUMMARY

An embodiment of the disclosed technology provides a method for manufacturing an array substrate, comprising: forming a gate line, a gate electrode, a data line, an active layer with a channel, a source electrode, a drain electrode and a pixel electrode on a base substrate, wherein the procedure for forming the data line, the active layer with the channel, the source electrode, the drain electrode and the pixel electrode comprising:

forming an active layer thin film and a data line metal thin film;

applying a photoresist on the data line metal thin film and performing exposure and development processes by using a multi-tone mask so as to form a photoresist pattern including a third thickness region, a second thickness region and a first thickness region whose thicknesses are successively increased, the third thickness region at least corresponding to the pixel electrode, the second thickness region corresponding to the data line, the active layer, the source electrode and the drain electrode;

etching the data line metal thin film and the active layer thin film corresponding to the third thickness region;

ashing and removing parts of the thickness of the photoresist so that the photoresist in the second thickness region is totally removed and the photoresist in the first thickness region at least partly remains;

forming a transparent conductive thin film on the base substrate with a remaining photoresist in the first thickness region thereon;

lifting off the remaining photoresist and the transparent conductive thin film formed thereon;

etching the exposed data line metal thin film and etching parts of the subsequently exposed active layer thin film; and etching the remaining and exposed active layer thin film other than the channel by a patterning process so as to form the data line, the source electrode, the drain electrode, the pixel electrode and the active layer with the channel.

Another embodiment of the disclosed technology provides an array substrate formed by the method for manufacturing an array substrate according to claim 1, wherein the transparent conductive thin film used for forming the pixel electrode remains on the data line, the source electrode and the drain electrode.

Still another embodiment of the disclosed technology provides a liquid crystal display comprising a display panel, wherein the display panel comprises a color filter substrate and the array substrate according to claim 17 which are bonded with each other.

Further scope of applicability of the disclosed technology will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Hereinafter, embodiments will be described in detail with reference to the accompanying drawings so that the objects, technical solutions and advantages of the embodiments will become more apparent. It should be noted that the embodiments described below are merely a portion of but not all of the embodiments of the disclosed technology, and thus various modifications, combinations or alterations can be made on the basis of the described embodiments without departing from the spirit and scope of the disclosed technology.

First Embodiment

Figure 1A:
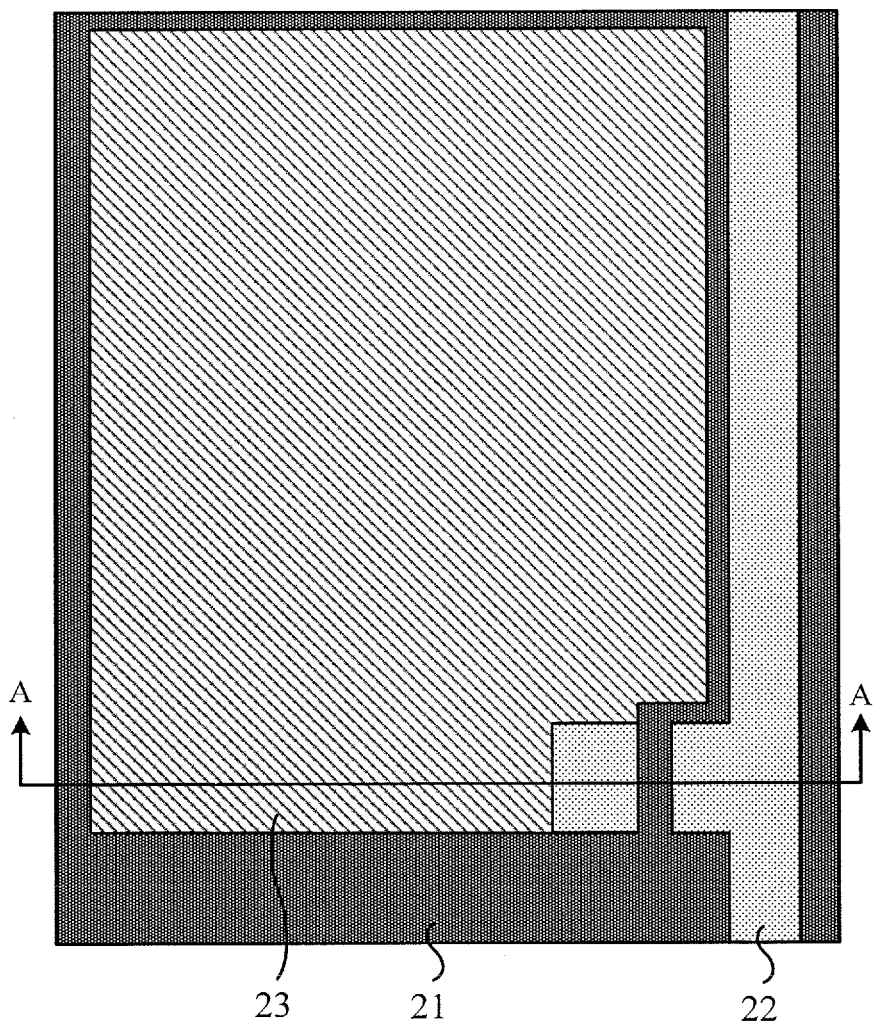
FIG. 1A is a first partial top view showing the array substrate taken at a phase of manufacture in the first embodiment of the disclosed technology.
Figure 1B:
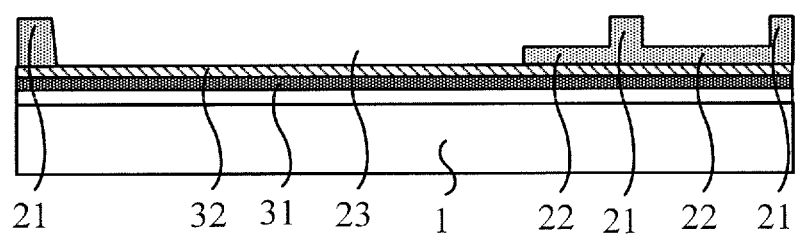
FIG. 1B is a side cross-sectional structural schematic view taken along the line A-A in FIG. 1A.
Figure 2A:
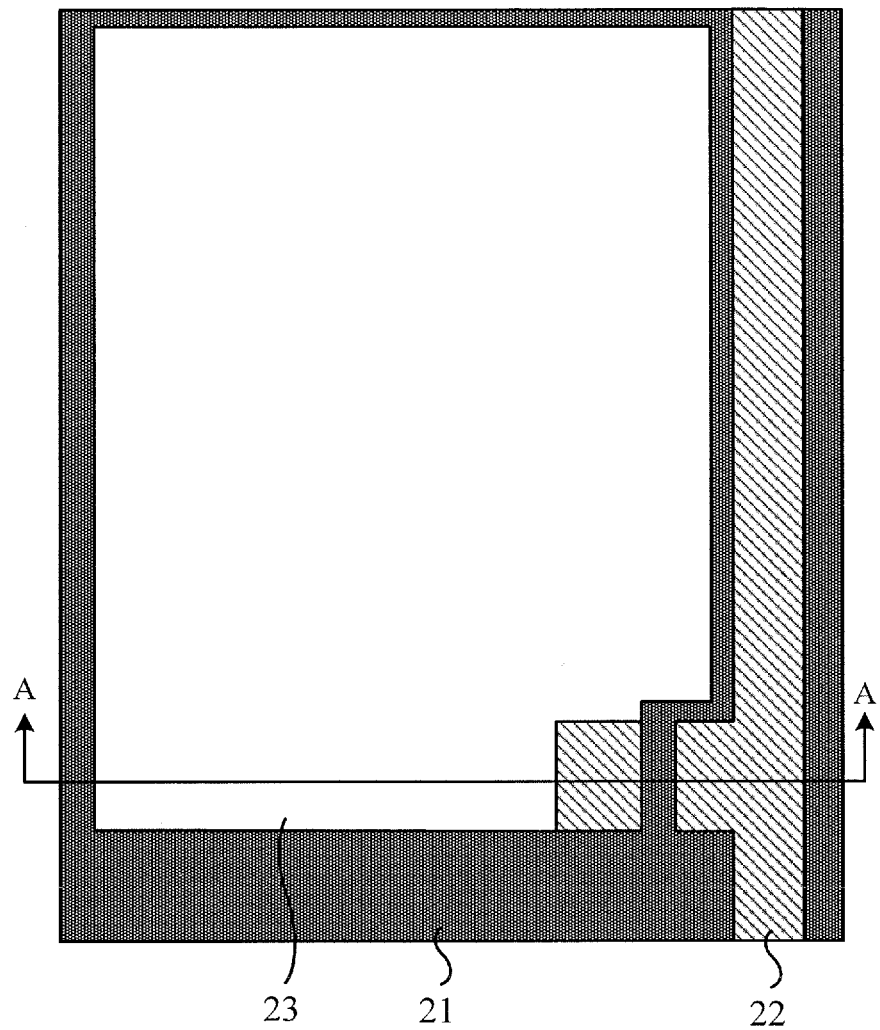
FIG. 2A is a second partial top view showing the array substrate taken at a phase of manufacture in the first embodiment of the disclosed technology.
Figure 2B:
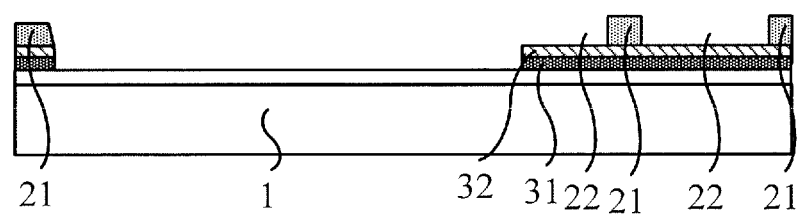
FIG. 2B is a side cross-sectional structural schematic view taken along the line A-A in FIG. 2A.
Figure 3A:
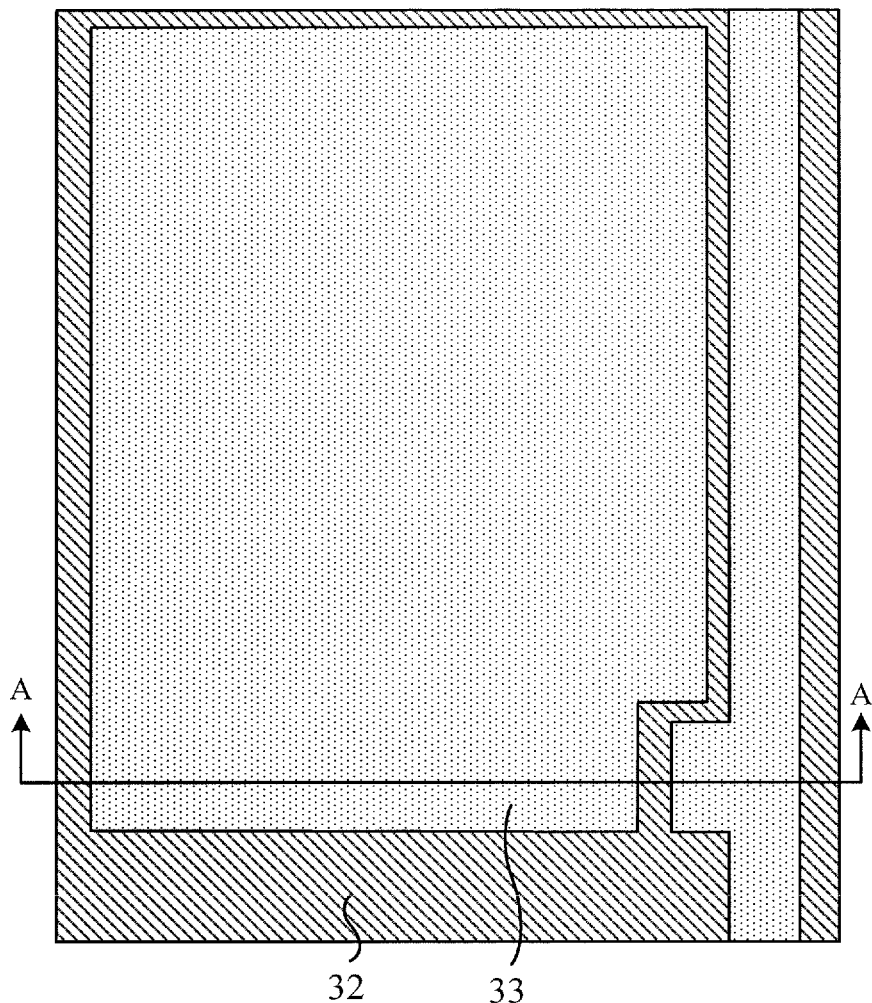
FIG. 3A is a third partial top view showing the array substrate taken at a phase of manufacture in the first embodiment of the disclosed technology.
Figure 3B:
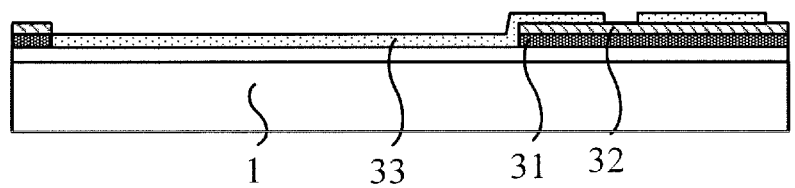
FIG. 3B is a side cross-sectional structural schematic view taken along the line A-A in FIG. 3A.
Figure 4A:
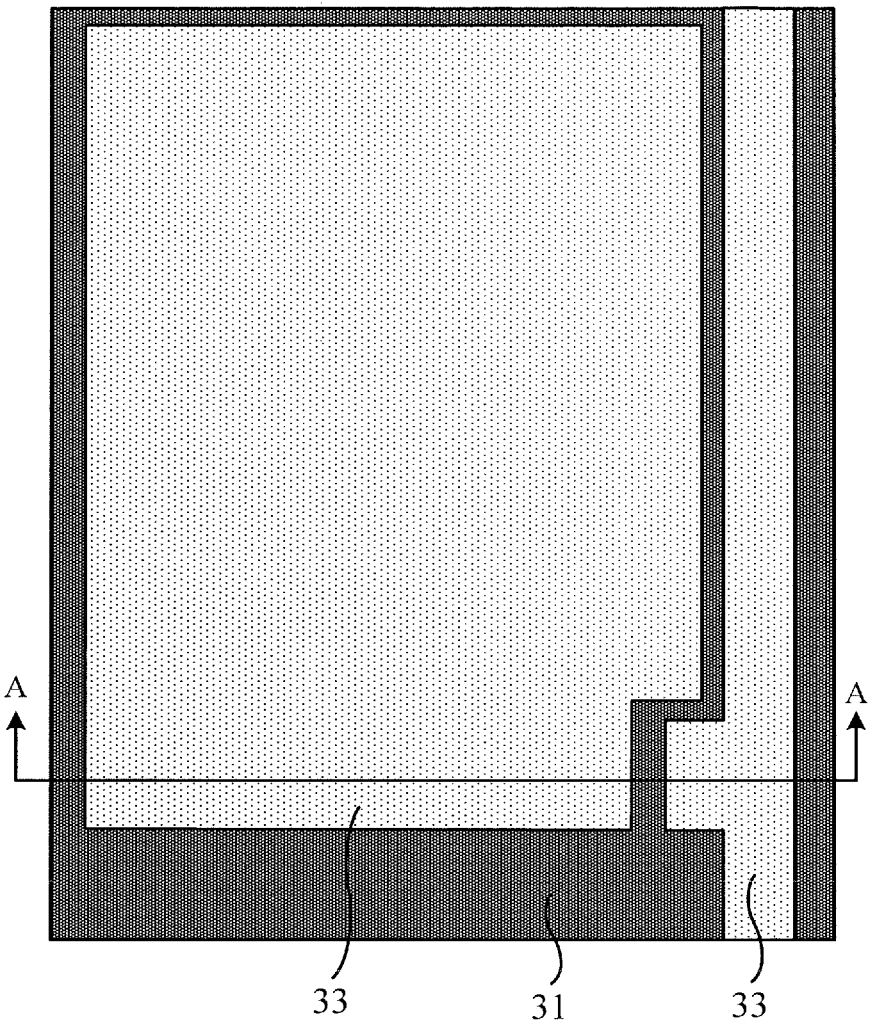
FIG. 4A is a fourth partial top view showing the array substrate taken at a phase of manufacture in the first embodiment of the disclosed technology.
Figure 4B:
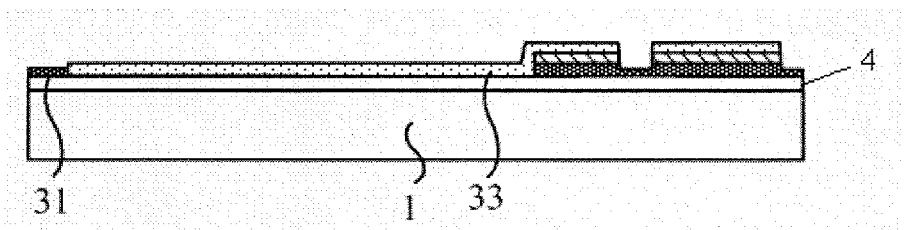
FIG. 4B is a side cross-sectional structural schematic view taken along the line A-A in FIG. 4A.

The manufacturing method of the array substrate provided by the first embodiment of the disclosed technology comprises a procedure of forming a gate line, a gate electrode, a data line, an active layer with a channel, a source electrode, a drain electrode and a pixel electrode on a base substrate, wherein the procedure of forming the data line, the active layer with the channel, the source electrode, the drain electrode and the pixel electrode includes the following steps:

Step 110: forming an active layer thin film 31 and a data line metal thin film 32;

Step 120: applying a photoresist on the data line metal thin film 32 and then exposing and developing the photoresist by using a multi-tone mask, so as to form a photoresist pattern which includes a third thickness region 23, a second thickness region 22 and a first thickness region 21, wherein the third thickness region 23 with the minimal thickness (i.e., a region without photoresist) at least corresponds to the pixel electrode; the second region 22 corresponds to the data line, the active layer with the channel, the source electrode and the drain electrode; and the first thickness region 21 corresponds to the other regions, as shown in FIG. 1A and FIG. 1B;

In this embodiment of the disclosed technology, the multi-tone mask may be a two-tone mask, for example, a gray-tone mask or a half-tone mask, etc.;

Step 130: etching the data line metal thin film 32 and the active layer thin film 31 corresponding to the third thickness region 23;

Step 140: ashing the photoresist to remove parts of the thickness of the photoresist, while parts of the photoresist within the first thickness region 21 remains; Specifically, ashing and removing the photoresist within the second thickness region 22 and decreasing the thickness of the photoresist within the first thickness region 21 to a certain extent;

Step 150: forming a transparent conductive thin film 33 on the base substrate on which the remaining photoresist is left in the first thickness region 21;

Step 160: lifting off the remaining photoresist and the transparent conductive thin film 33 formed thereon, as shown in FIG. 3A and FIG. 3B;

Step 170: performing an etching process on the exposed data line metal thin film 32 and parts of the active layer thin film 31 which is subsequently exposed, as shown in FIG. 4A and FIG. 4B;

Generally, the active layer thin film 31 comprises a semiconductor thin film and a doped semiconductor thin film. At this step, only the semiconductor thin film is etched, while the doped semiconductor thin film remains. If the active layer thin film 31 is a layer formed from single material, parts of the thickness of the active layer thin film 31 will be removed.

Step 180: performing a patterning process to remove the remaining and exposed active layer thin film 31 other than the channel so as to form the data line 5, the source electrode 7, the drain electrode 8, the pixel electrode 11 and the active layer 6 with the channel, wherein the data line 5, the source electrode 7 and the drain electrode 8 are still covered with the transparent conductive film for the pixel electrode 11 which may be directly connected to the drain electrode 8 without influencing the conductivity of the data line 5.

Figure 5A:
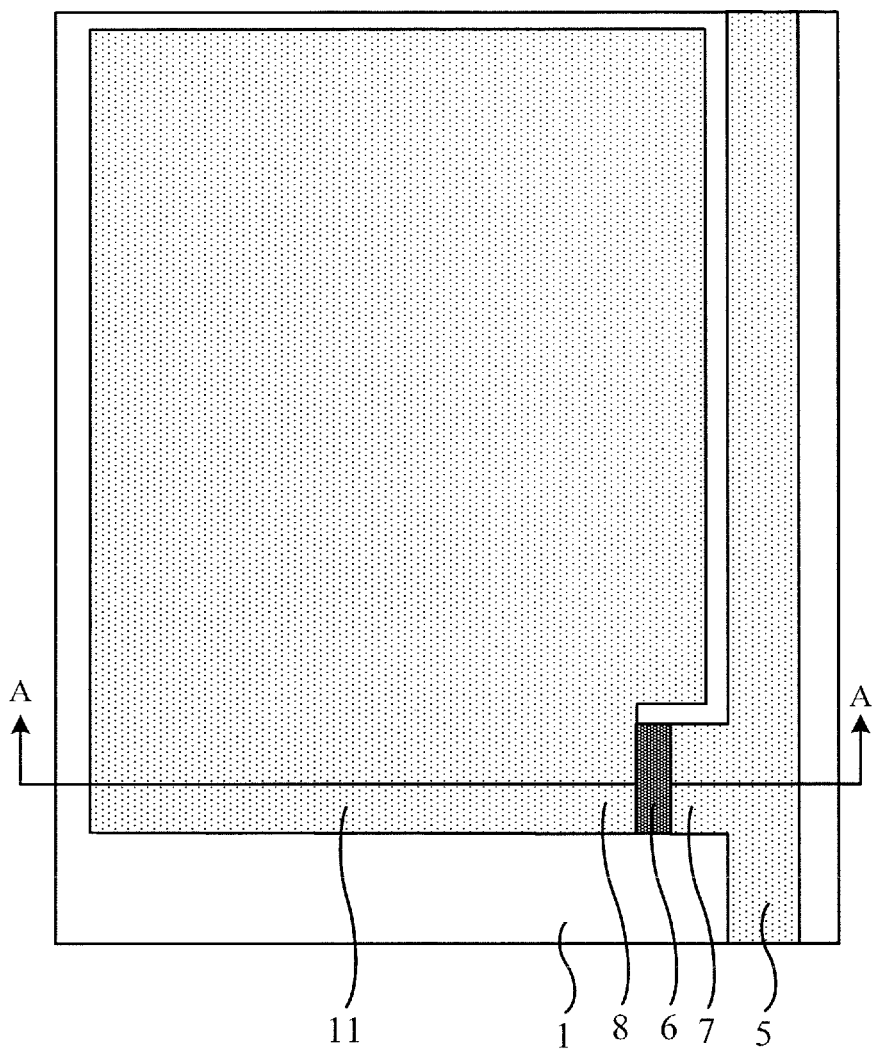
FIG. 5A is a partial top view showing the manufactured array substrate of the first embodiment of the disclosed technology.
Figure 5B:
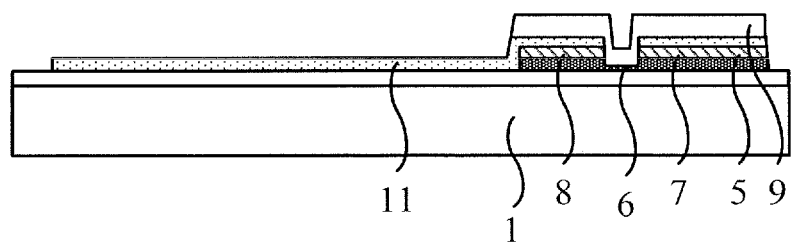
FIG. 5B is a side cross-sectional structural schematic view taken along the line A-A in FIG. 5A.

At the step 180, an individual patterning process using a photoresist as a mask can be used. In this process, the channel is covered with the photoresist and then the rest exposed active layer thin film is etched. For example, the etching is performed by using the known methods. One of the methods for performing step 180 comprises the following steps:

forming a passivation layer 9 on the base substrate 1 with structures thus formed thereon;

etching the passivation layer 9 and the remaining and exposed active layer thin film other than the channel in order to form a protective layer above the channel. At the same time, the data line 5, the source electrode 7, the drain electrode 8, the pixel electrode 11 and the active layer 6 with the channel are formed, as shown in FIG. 5A and FIG. 5B.

In this embodiment, steps of forming other patterns on the array substrate are not restricted. For example, the procedure of forming the gate line and the gate electrode before the formation of the active layer thin film and the data line metal thin film comprises: forming a gate metal thin film on the base substrate; etching the gate metal thin film to form the gate line and the gate electrode by a patterning process with a single tone mask; forming a gate insulation layer on the base substrate with patterns thus formed thereon. This is a typical method for forming the gate line and the gate electrode. Besides, the gate line and the gate electrode can also be formed in other positions or by other methods, according to the specific patterns and locations thereof.

This embodiment only relates to the process of forming patterns in the display region on the base substrate. Patterns in the interface region on the base substrate which can be formed by other process are preferably formed by the procedure mentioned above. For example, the photoresist in the third thickness region formed at step 120, which corresponds to the pixel electrode, can also corresponds to the gate line interface via hole in the interface region. And at the step 130, in addition to etching the data line metal thin film and the active layer thin film, the underlying gate insulation layer can also be etched by elongating the etching time so that the gate line interface via hole is formed. Etching gases such as $SF_6$, $O_2$, He can be properly selected to be able to etch the $SiN_x$ of the gate insulation layer.

In this embodiment, the active layer on both sides of the data line and the active layer on the channel can be etched by a dry etching process. Therefore, the Active Wing which could have formed on both sides of the data line in the existing technology will be not formed in this embodiment of the disclosed technology. As a result, the actual line-width is reduced, and the performance of the TFT is improved.

In this embodiment, by lifting off the photoresist, the data line, the active layer with the channel, the source electrode, the drain electrode, and the pixel electrode are formed by two mask processes so as to reduce the number of times of exposing and thus decrease the cost compared with the existing technology. On the other hand, since the data line and the pixel electrode are exposed and developed by a same mask, the parasitic capacitance (Cpd) of an overlap region between the pixel electrode and the data line caused by the error coverage in the existing technology can be overcome.

Second Embodiment

Figure 6A:
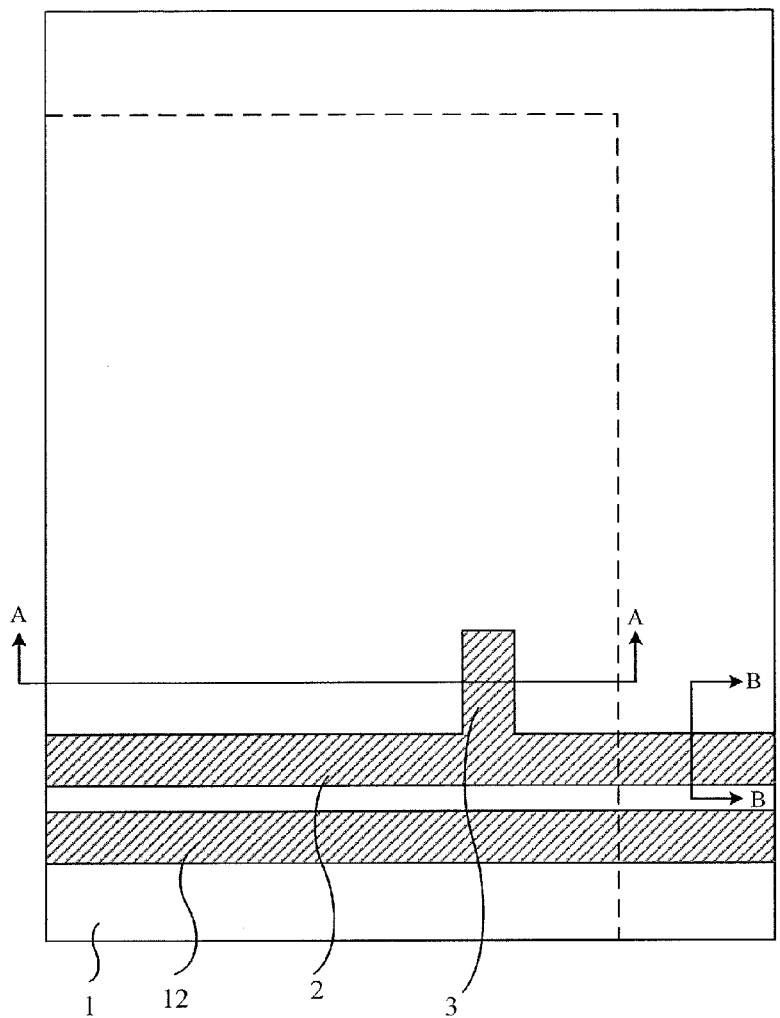
FIG. 6A is a first partial top view showing the array substrate taken at a phase of manufacture in the second embodiment of the disclosed technology.
Figure 6B:
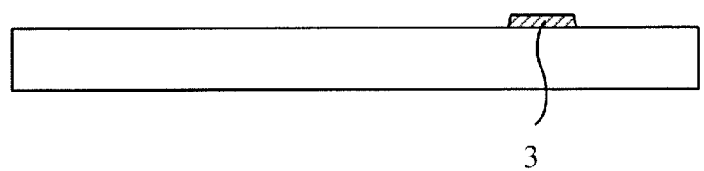
FIG. 6B is a side cross-sectional structural schematic view taken along the line A-A in FIG. 6A.
Figure 6C:
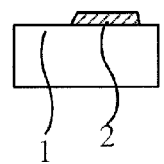
FIG. 6C is a side cross-sectional structural schematic view taken along the line B-B in FIG. 6A.
Figure 7A:
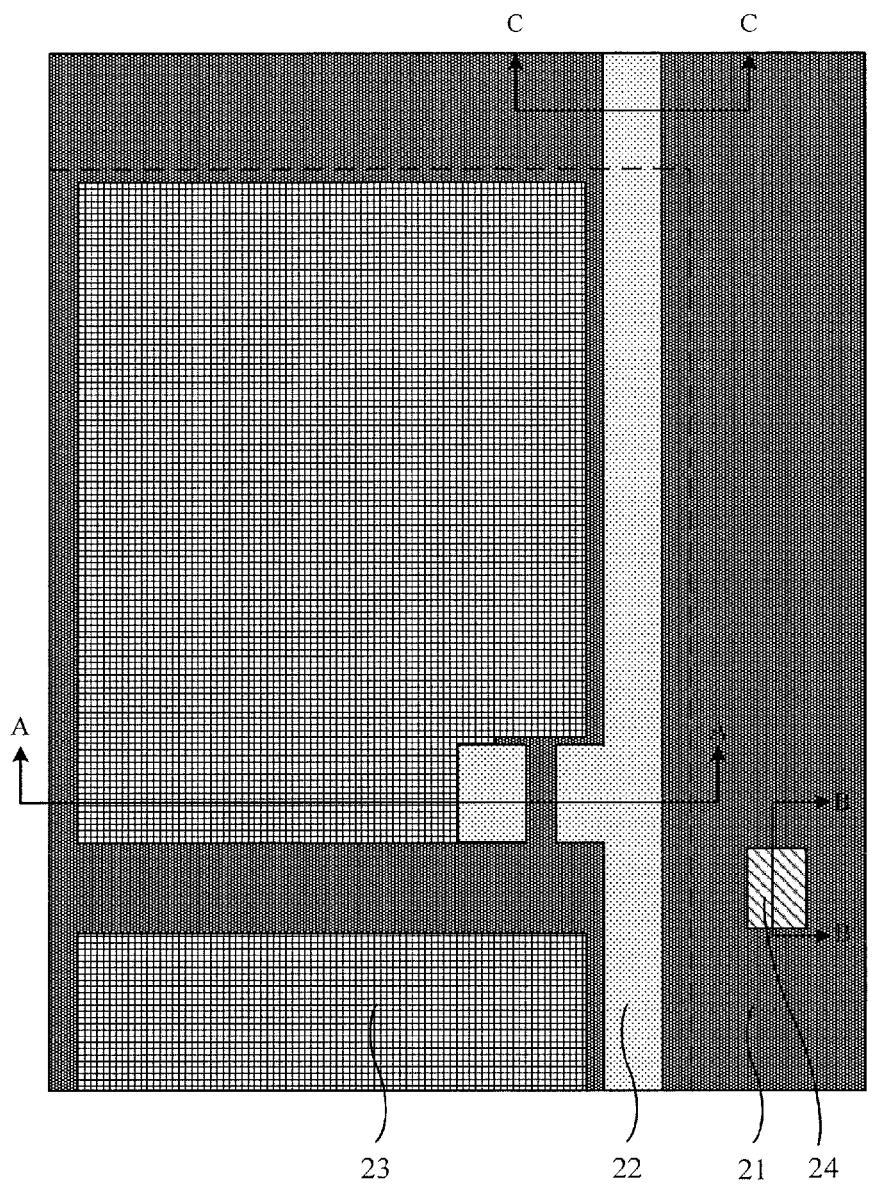
FIG. 7A is a second partial top view showing the array substrate taken at a phase of manufacture in the second embodiment of the disclosed technology.
Figure 7B:
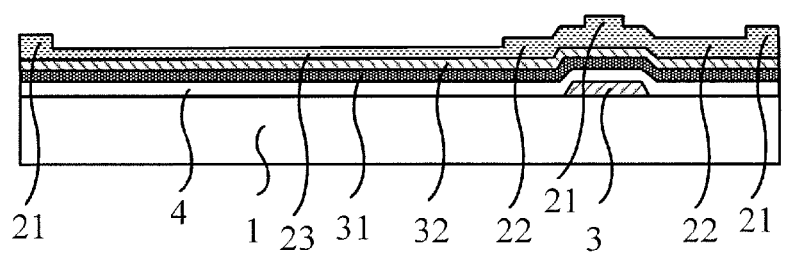
FIG. 7B is a side cross-sectional structural schematic view taken along the line A-A in FIG. 7A.
Figure 7C:
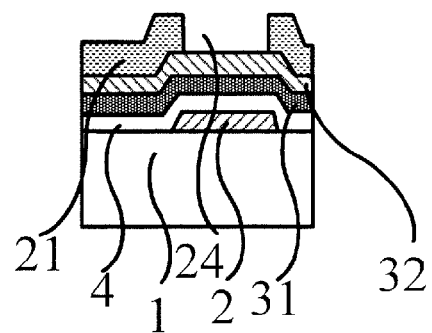
FIG. 7C is a side cross-sectional structural schematic view taken along the line B-B in FIG. 7A.
Figure 7D:
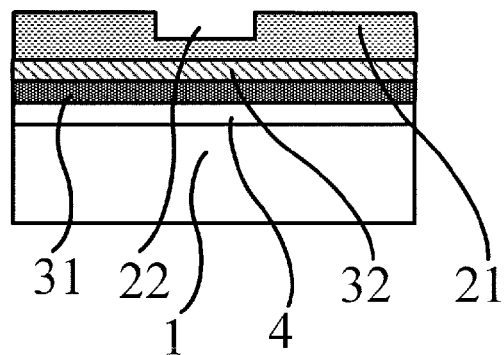
FIG. 7D is a side cross-sectional structural schematic view taken along the line C-C in FIG. 7A.

The second embodiment of the disclosed technology provides a manufacturing method of the array substrate. Based on the first embodiment, in particular, since the gate line and the gate electrode are formed before the formation of the data line, a gate interface via hole and a data line interface via hole are formed simultaneously with the formation of a data line, an active layer, an source electrode, an drain electrode, an pixel electrode and an active layer with an channel. The so-called gate line interface via hole is a via hole corresponding to and above the gate line in the interface region, and the so-called data line interface via hole is a via hole corresponding to and above the gate line in the interface region. In the first embodiment, the gate line interface via hole and the data line interface via hole may be separately formed at different steps or by other process. However, this embodiment provides a preferable solution for manufacturing the array substrate, which comprises the following steps:

Step 710: forming a gate metal thin film on the base substrate 1, wherein the base substrate 1 may be a glass substrate; a conductive metal material layer having a thickness of 500 to 5000 Å is deposited as the gate metal thin film on the base substrate, and the conductive metal material can be selected form molybdenum (Mo), aluminum (Al), titanium (Ti), copper (Cu), etc. for example;

Step 720: etching the gate metal thin film by a patterning process with a single tone mask to form the gate electrode 3 and the gate line 2, wherein according to the design requirements, a common electrode line 12 may be formed simultaneously, as shown in FIGS. 6A, 6B and 6C, and a gate insulation layer 4 is deposited on the gate electrode 3 and the gate line 2;

In particular, the first mask patterning process used for forming the gate electrode 3 and the gate line 2 may comprise the following steps: applying a photoresist having a thickness of 10000 to 20000 Å; performing exposing and developing to form a photoresist pattern in which the totally reserved region corresponds to the gate electrode 3 and the gate line 2; etching the gate metal thin film under the protection of the reserved photoresist so as to form the gate electrode 3 and the gate line 2; and finally removing the reserved photoresist.

Then, the procedure of forming the data line 5, the active layer 6 with a channel, the source electrode 7, the drain electrode 8, the pixel electrode 11, the gate line interface via hole 13 and the data line interface via hole 14 comprising:

Step 730: forming an active layer thin film 31 and a data line metal thin film 32 on the base substrate 1 with the patterns thus formed thereon, for example, the gate insulation layer 4, the active layer thin film 31 and the data line metal thin film 32 being successively formed.

At this step, the gate insulation layer 4 having a thickness of about 2000 to 6000 Å and the semiconductor layer having a thickness of about 500 to 3000 Å which is used as the active layer thin film 31 may be successively deposited. The active layer thin film 31 usually includes a semiconductor thin film and a doped semiconductor thin film formed thereon; then, a metal material layer with good conductivity whose thickness is about 2000 to 6000 Å can be deposited as the data line metal thin film 32. Thereafter, the second mask patterning process is performed as follows:

Step 740: applying a photoresist on the data line metal thin film 32 and performing exposing and developing by using a three-tone mask so that a photoresist pattern including a fourth thickness region 24, a third thickness region 23, a second thickness region 22 and a first thickness region 21 is formed, as shown in FIGS. 7A, 7B, 7C and 7D.

The procedure at this step is used to form a photoresist pattern having a stepped thickness. Compared with the first embodiment, a step having a fourth thickness is further formed in the photoresist pattern. The thinnest photoresist is formed in the third thickness region 23 and there is no photoresist in the fourth thickness region 24. Therefore, at this step, the fourth thickness region 24 without any photoresist corresponds to the gate line interface via hole; the third thickness region 23 in which the thickness of the photoresist is about 1000 to 7000 Å corresponds to the pixel electrode; the second thickness region 22 in which the thickness of the photoresist is about 11000 to 17000 Å corresponds to the data line, the active layer with the channel, the source electrode, the drain electrode and the data line interface via hole; the first thickness region 21 in which the photoresist having the thickness of about 30000 to 40000 Å is totally reserved corresponds to other structures, i.e., the channel and the gap between respective pixel electrodes.

Step 750: performing a first etching process to etch the data line metal thin film 32, the active layer thin film 31 and the gate insulation layer 4 corresponding to the fourth thickness region 24 so that the gate line interface via hole 13 is formed, as shown in FIG. 10;

Step 760: performing a first ashing process to remove parts of thickness of the photoresist according to the thickness of the photoresist in the third thickness region 23; Preferably, the ashed thickness is slightly larger than the thickness of the photoresist in the third thickness region 23 and at least smaller than the thickness of the photoresist in the second thickness region 22. Referring to the thickness of the photoresist described above, a layer of photoresist of about 5000 to 10000 Å is preferably ashed and removed at this step.

Step 770: performing a second etching process to etch the data line metal thin film 32 and the active layer thin film 31 corresponding to the third thickness region 23, as shown in FIGS. 9A, 9B, 9C and 9D.

At this step, the data line metal thin film 32 may be etched by a wet etching process and the active layer thin film 31 may be etched by a dry etching process.

Step 780: Similar with the first ashing process, performing a second ashing process to remove parts of the photoresist according to the thickness of the remaining photoresist in the second thickness region 22, wherein the ashed thickness is slightly larger than the thickness of the remaining photoresist in the second thickness region 22 and at least smaller than the thickness of the remaining photoresist in the first thickness region 21. Referring to the thickness of the photoresist described above, a layer of photoresist of 5000 to 10000 Å is preferably ashed and removed at this step.

Figure 10A:
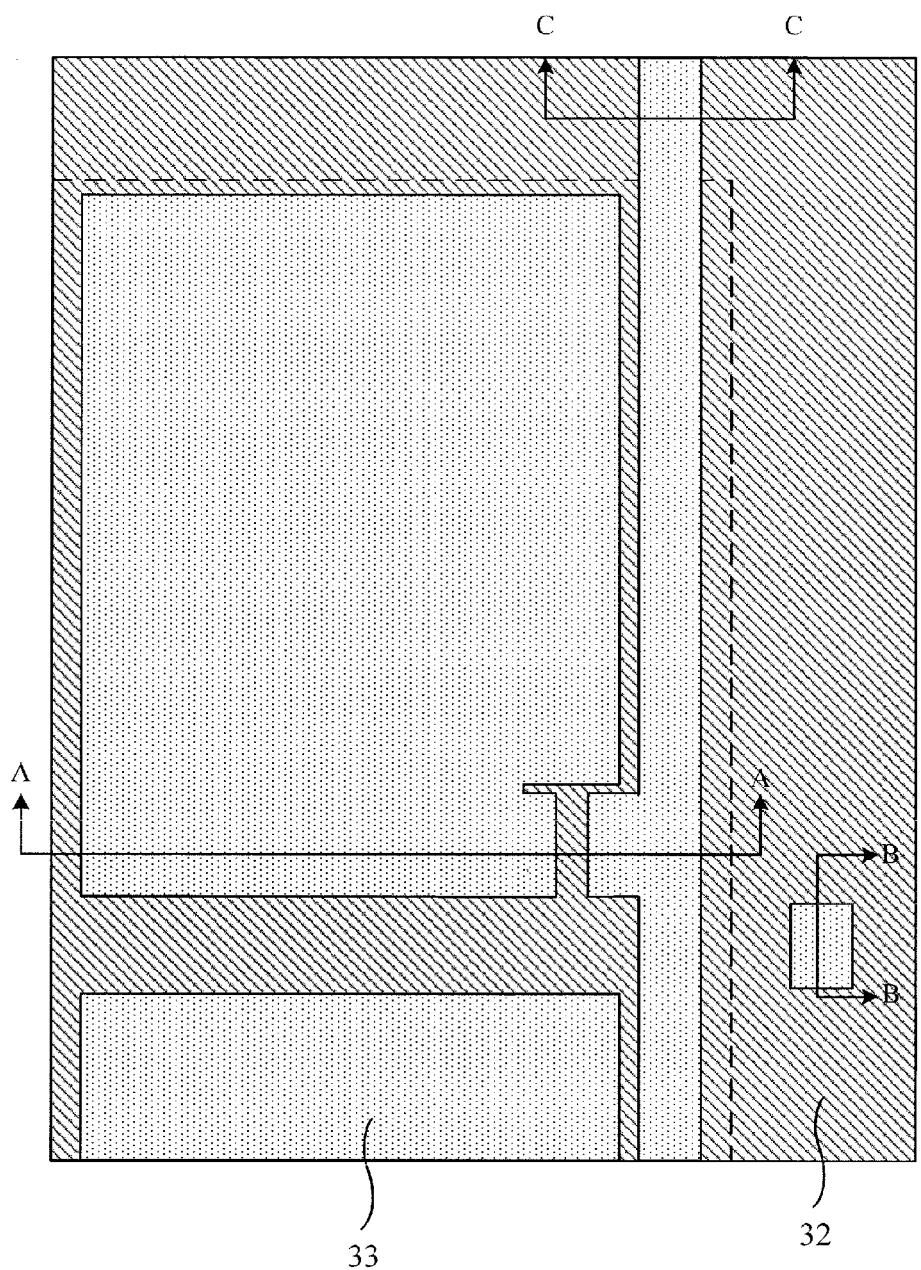
FIG. 10A is a fifth partial top view showing the array substrate taken at a phase of manufacture in the second embodiment of the disclosed technology.
Figure 10B:
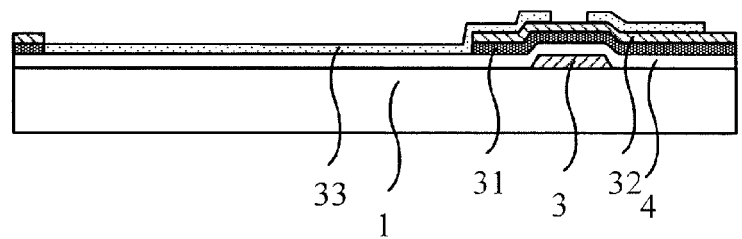
FIG. 10B is a side cross-sectional structural schematic view taken along the line A-A in FIG. 10A.
Figure 10C:
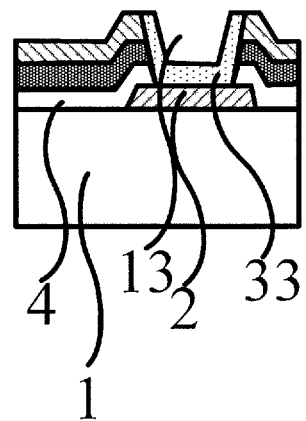
FIG. 10C is a side cross-sectional structural schematic view taken along the line B-B in FIG. 10A.
Figure 10D:
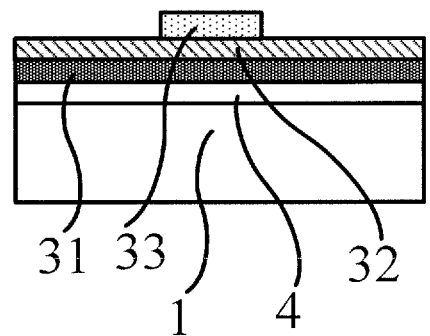
FIG. 10D is a side cross-sectional structural schematic view taken along the line C-C in FIG. 10A.
Figure 11A:
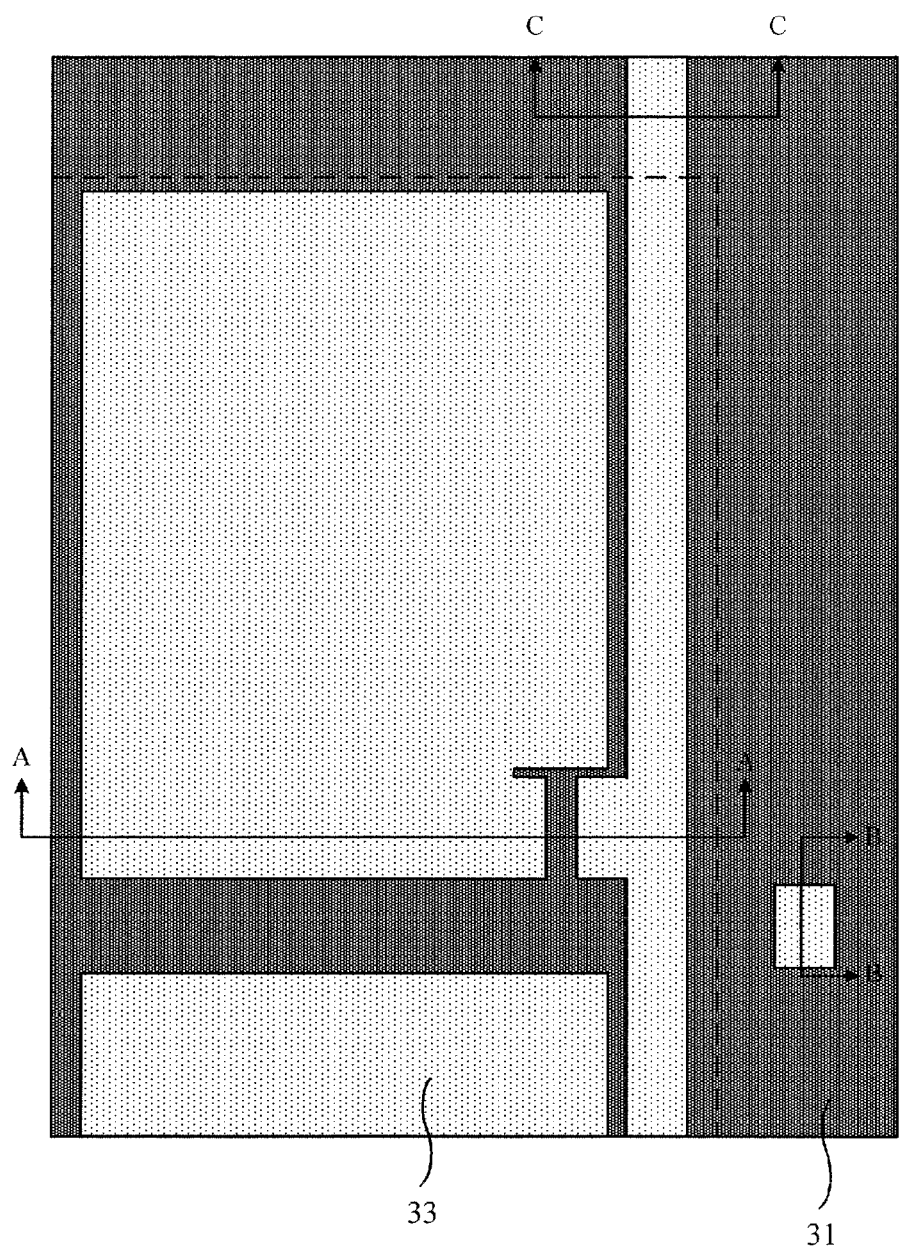
FIG. 11A is a sixth partial top view showing the array substrate taken at a phase of manufacture in the second embodiment of the disclosed technology.
Figure 11B:
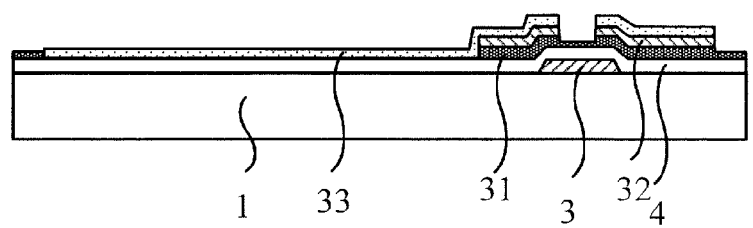
FIG. 11B is a side cross-sectional structural schematic view taken along the line A-A in FIG. 11A.
Figure 11C:
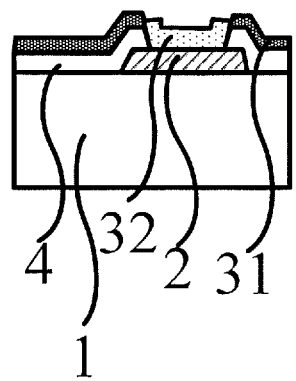
FIG. 11C is a side cross-sectional structural schematic view taken along the line B-B in FIG. 11A.
Figure 11D:
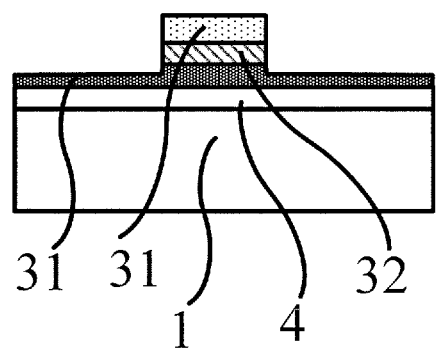
FIG. 11D is a side cross-sectional structural schematic view taken along the line C-C in FIG. 11A.
Figure 12A:
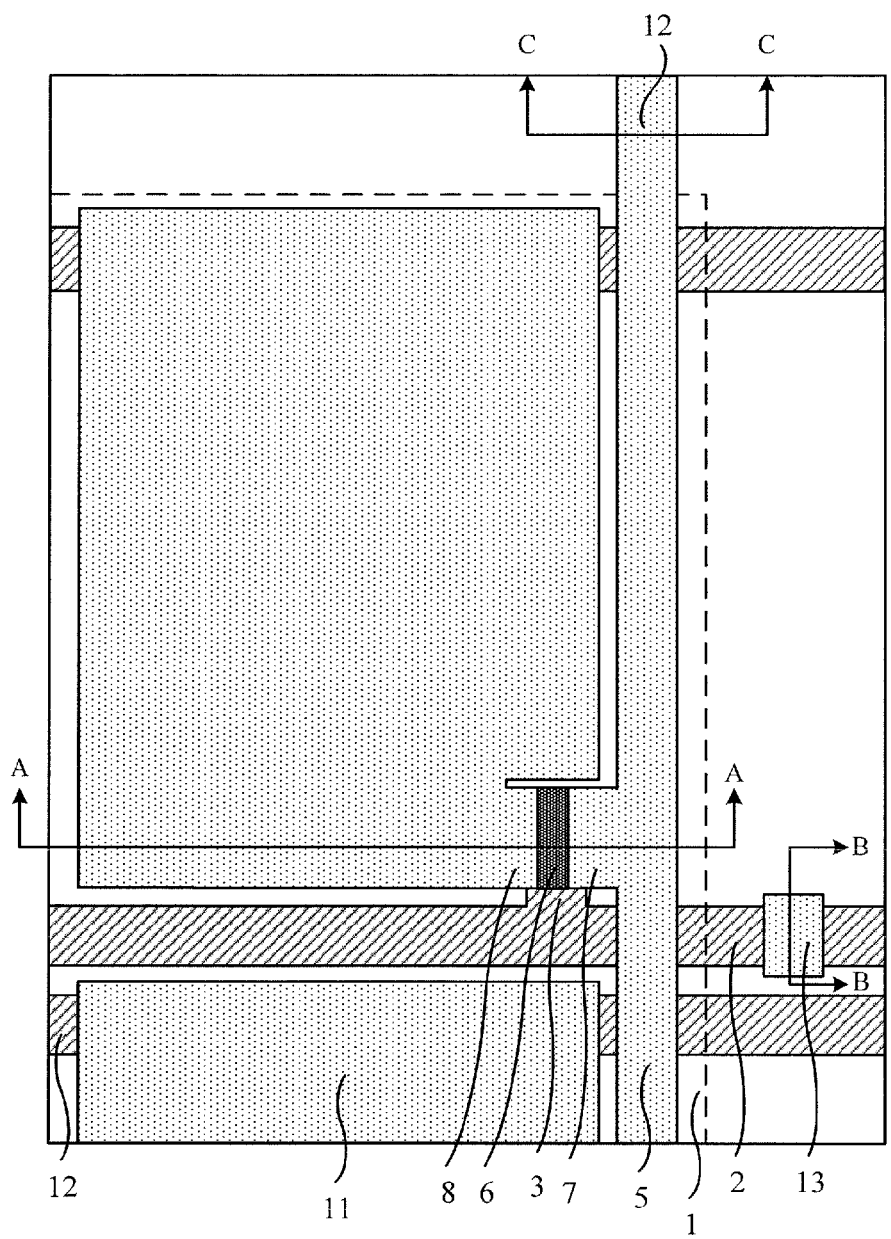
FIG. 12A is a partial top view showing the manufactured array substrate of the second embodiment of the disclosed technology.
Figure 12B:
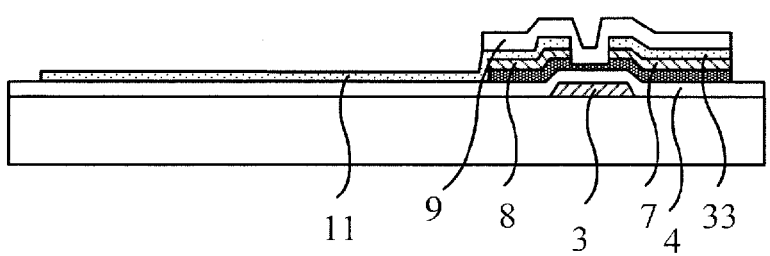
FIG. 12B is a side cross-sectional structural schematic view taken along the line A-A in FIG. 12A.
Figure 12C:
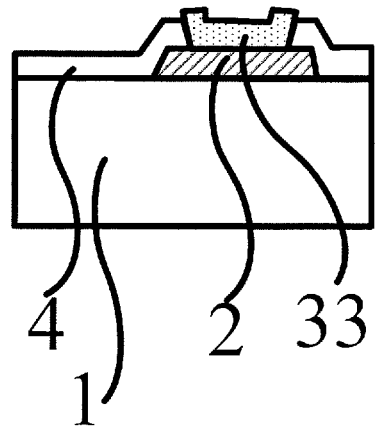
FIG. 12C is a side cross-sectional structural schematic view taken along the line B-B in FIG. 12A.
Figure 12D:
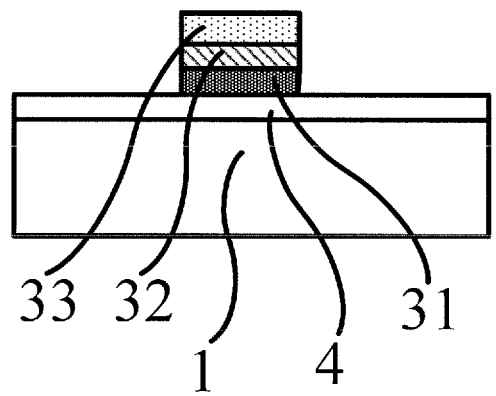
FIG. 12D is a side cross-sectional structural schematic view taken along the line C-C in FIG. 12A.

Step 790: forming a transparent conductive thin film 33 on the base substrate 1 with the remaining photoresist in the first thickness region 21 thereon, wherein the transparent conductive material of pixel electrode 11 may be a-ITO (Indium Tin Oxides) or IZO (Indium Zinc Oxides), and the transparent conductive thin film 33 preferably has a thickness of 100 to 800 Å;

Step 7100: lifting off the remaining photoresist and the transparent conductive thin film 33 formed thereon, as shown in FIGS. 10A: 10B: 10C and 10D;

Step 7110: etching the exposed data line metal thin film 32 and etching parts of the active layer thin film 31 which is subsequently exposed, as shown in FIGS. 11A: 11B: 11C and 11D;

At this step, since different types of etchant are needed for etching the materials of the pixel electrode 11 and the data line metal thin film 32, the underlying data line metal thin film 32 and the active layer thin film 31 may be covered with the transparent conductive thin film 33 of the pixel electrode 11. And, the underlying data line metal thin film 32 and the active layer thin film 31 will be reserved at this etching process. In particular, wet etching solution such as a mixture of phosphoric acid ($H_3PO_4$) and acetic acid ($CH_3COOH$) and nitric acid ($HNO_3$) may be used for etching the data line metal thin film 32 which usually made of material such as aluminum, molybdenum or the like. Generally, a mixture of the hydrochloric acid (HCL) and acetic acid ($CH_3COOH$) may be used to etch the transparent conductive thin film 33 made of ITO or the like.

Thereafter, the remaining and exposed active layer thin film 31 other than the channel is etched by using a patterning process so as to form the data line 5, the source electrode 7, the drain electrode 8, the pixel electrode 11, the active layer 6 with the channel and the data line interface via hole 14. In fact, the data line interface via hole 14 and the data line 5 are exposed together. The specific steps are as follows:

Step 7120: forming a passivation layer 9 on the base substrate 1 with structures thus formed thereon, the thickness of the passivation layer 9 preferably being 1000 to 6000 Å;

Step 7130: etching the passivation layer 9 and the remaining and exposed active layer thin film other than the channel at step 7110 by a patterning process with a single tone mask to form a channel protective layer above the channel, as shown in FIGS. 12A, 12B, 12C and 12D. At this step, the passivation layer 9 used as the channel protective layer at least remains above the channel. Further, the coverage range of the passivation layer 9 can be enlarged, as long as the gate line interface via hole 13 and the data line interface via hole 14 are exposed.

At this step, the procedure of etching the passivation layer and the remaining and exposed active layer thin film other than the channel by a patterning process with a single tone mask so as to form a channel protective layer above the channel comprises the following steps:

Step 7131: applying a photoresist having a thickness of preferred 10000 to 20000 Å on the passivation layer;

Step 7132: exposing and developing the photoresist by using a single tone mask so that a totally reserved region and a totally removed region of the photoresist are formed;

Step 7133: etching the passivation layer and the remaining active layer thin film corresponding to the totally removed region, so as to form a channel protective layer pattern above the channel;

Step 7134: ashing and removing the remaining photoresist.

In this embodiment, the active layer thin film may include a semiconductor layer thin film and a doped semiconductor layer thin film. The doped semiconductor layer thin film is etched when the channel is formed, and the exposed semiconductor layer thin film is etched when the passivation layer is etched.

In this embodiment, the thicknesses of respective steps of the photoresist are preferably as follows:

The thickness of the photoresist for etching the data line metal thin film, the active layer thin film and the gate insulation layer, i.e. the thickness of the photoresist in the first thickness region is 30000 to 40000 Å, the thickness of the photoresist in the second thickness region is 11000 to 17000 Å, and the thickness of the photoresist in the third thickness region is 1000 to 7000 Å; the thickness of the photoresist removed by the first ashing process is 5000 to 10000 Å; the thickness of the photoresist removed by the second ashing process is 5000 to 10000 Å. The above preferred thicknesses may effectively protect structures under respective steps of the photoresist.

In this embodiment, the array substrate can be formed by only three mask patterning processes. Therefore, the manufacture procedure is simplified, and the cost is reduced.

Third Embodiment

The third embodiment of the disclosed technology provides a method for manufacturing the array substrate. This embodiment is similar with the second embodiment except that a single tone mask is adopted to etch the passivation layer and the remaining active layer thin film by a patterning process so as to form a channel protective layer pattern on the channel. The procedure can be performed as follows:

Step 151: applying a photoresist on the passivation layer;

Step 152: exposing and developing the photoresist with a single tone mask so as to form a photoresist pattern including a totally reserved region and a totally removed region;

Step 153: etching the passivation layer corresponding to the totally removed region so as to form a channel protective layer pattern above the channel;

Step 154: ashing and removing the remaining photoresist;

Step 155: etching the exposed remaining active layer thin film when the channel is protected by the passivation layer so that the active layer thin film remains on the channel.

Generally, an etching gas for etching passivation layer (PVX) is sulfur hexafluoride ($SF_6$)/oxygen ($O_2$)/helium (He); an etching gas for etching the active layer thin film (Act) is sulfur hexafluoride ($SF_6$)/chlorine ($Cl_2$), In the case of an etching gas of sulfur hexafluoride ($SF_6$)/chlorine ($Cl_2$), the etching rate of the passivation layer to that of the active layer thin film is about 1:20, that is, the passivation layer is little destroyed when the active layer thin film is etched. Therefore, the passivation layer and the active layer thin film can be etched respectively.

In respective embodiments of the disclosed technology, fewer raw materials are needed and the procedure is simplified.

Fourth Embodiment

Figure 13:
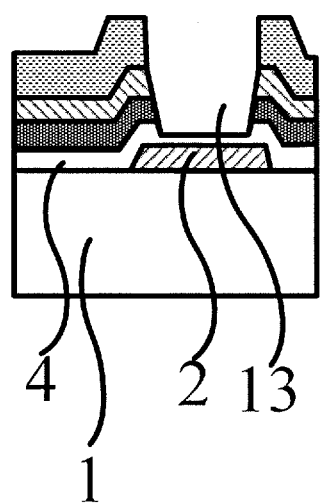
FIG. 13 is a partial top view showing the array substrate taken at a phase of manufacture in a fourth embodiment of the disclosed technology.

The fourth embodiment of the disclosed technology provides a method for manufacturing an array substrate. The fourth embodiment is similar with the second embodiment or the third embodiment, except that:

The procedure at step 750 for performing a first etching process to etch the data line metal thin film 32, the active layer thin film 31 and the gate insulation layer 4 corresponding to the fourth thickness region 24 so as to form the gate line interface via hole 13 in detail comprises etching the data line metal thin film 32, the active layer thin film 31 and parts of the gate insulation layer 4 corresponding to the fourth thickness region 24 so as to form the gate line interface via hole 13, wherein parts of the gate insulation layer 4 remains in the gate line interface via hole 13, as shown in FIG. 13. Preferably, the remaining gate insulation layer has a thickness of 100 to 1000 Å

Figure 8:
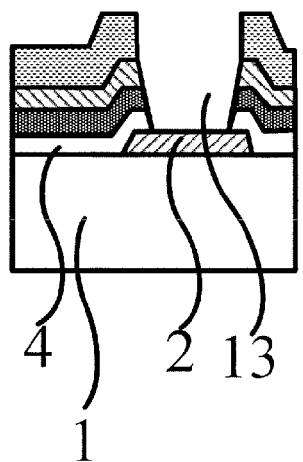
FIG. 8 is a third partial top view showing the array substrate taken at a phase of manufacture in the first embodiment of the disclosed technology.
Figure 9A:
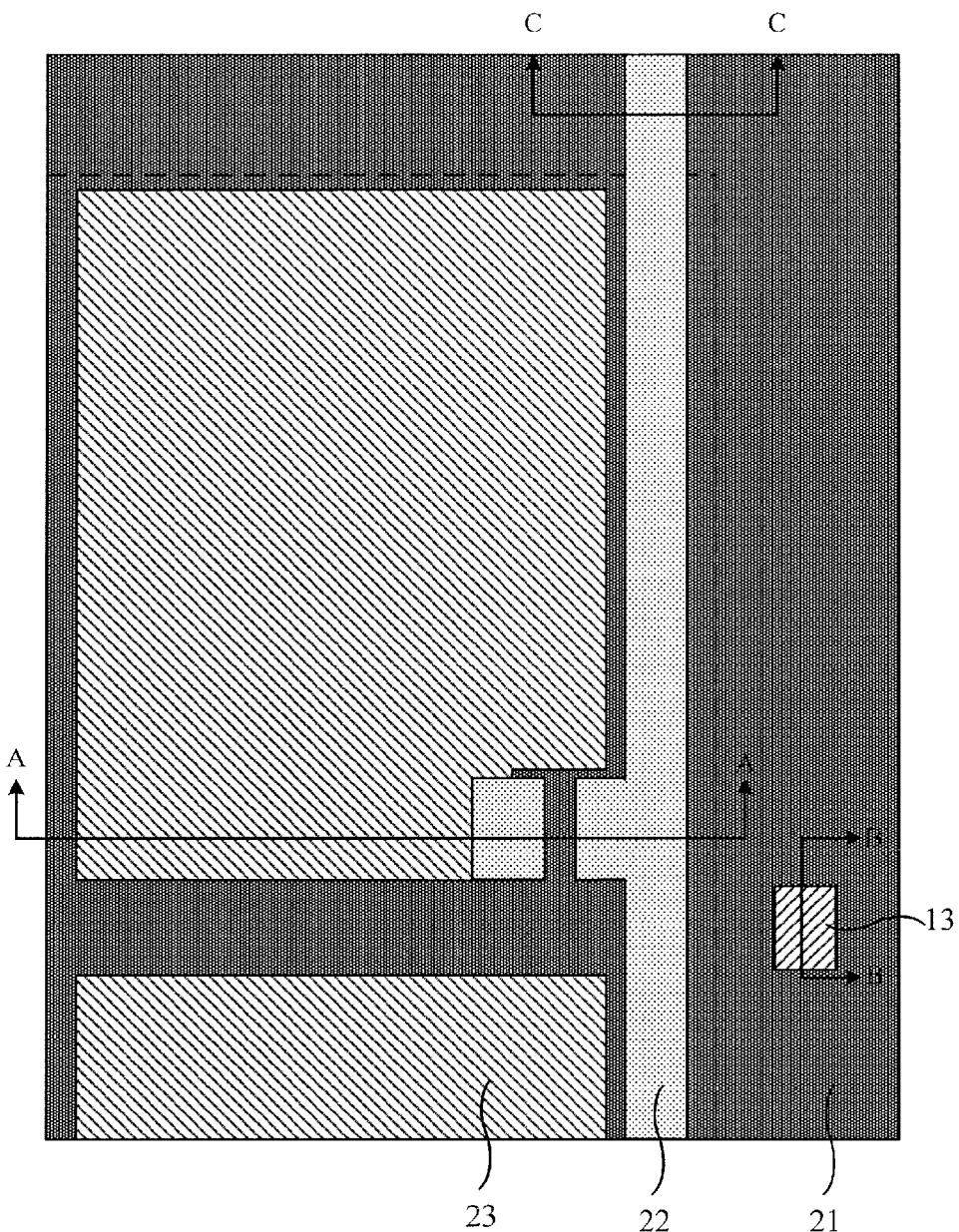
FIG. 9A is a fourth partial top view showing the array substrate taken at a phase of manufacture in the second embodiment of the disclosed technology.
Figure 9B:
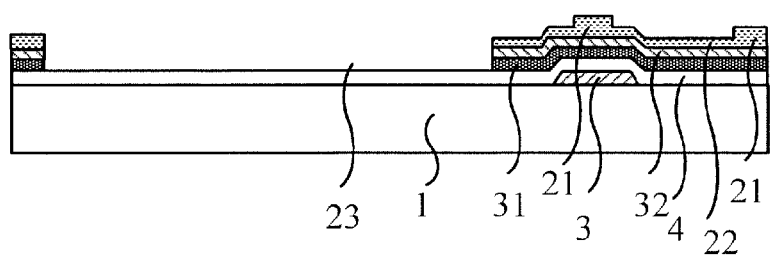
FIG. 9B is a side cross-sectional structural schematic view taken along the line A-A in FIG. 9A.
Figure 9C:
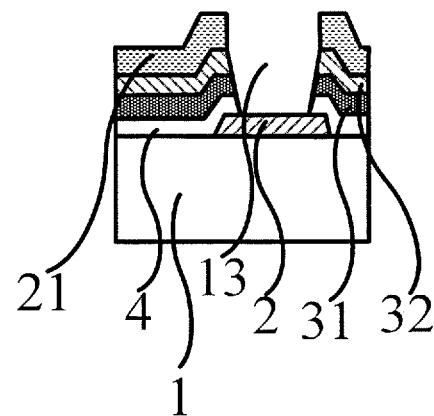
FIG. 9C is a side cross-sectional structural schematic view taken along the line B-B in FIG. 9A.
Figure 9D:
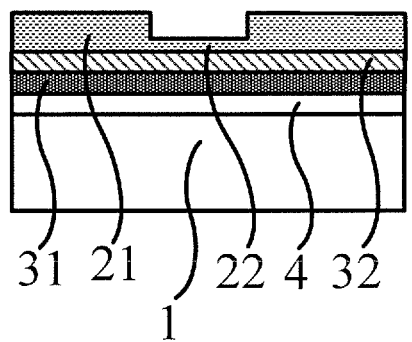
FIG. 9D is a side cross-sectional structural schematic view taken along the line C-C in FIG. 9A.

At step 770, the second etching process is further performed to etch the remaining gate insulation layer thin film corresponding to the fourth thickness region, when the data line metal thin film and the active layer thin film corresponding to the third thickness region are etched. The structure thus formed can refer to FIG. 8. In particular, the gate insulation layer thin film is etched when the active layer thin film is dry etched. This method can prevent the gate line under the gate line interface via hole from being etched when the data line metal thin film is etched. Indeed, in the second embodiment or in the third embodiment, other methods for protecting the gate line under the gate line interface via hole can also be used. For example, the gate line and the data line can be made of different materials so that they can be etched by different processes; in another way, a gate line having a relatively larger thickness is formed so that parts of the gate line can be reserved after the etching of the data line metal thin film.

Furthermore, the procedure of etching the exposed data line metal thin film and the subsequently exposed active layer thin film after the step 7110 of lifting off the photoresist and the transparent conductive thin film in detail comprises: etching the exposed data line metal thin film by a particular etching solution which will not etch the pixel electrode thin film, and successively dry etching parts of the exposed active layer thin film.

An embodiment of the disclosed technology further provides an array substrate which is the array substrate fabricated by any of the manufacturing methods provided by the embodiments of the disclosed technology. The transparent conductive thin film used for the pixel electrode is reserved on the data line, the source electrode and the drain electrode, as shown in drawings of the foregoing embodiments. Furthermore, the pixel electrode is directly connected to the gate insulation layer in the region other than TFT-switch region on the base substrate. Since there is no passivation layer between the pixel electrode and the common electrode line on the substrate, the distance between the pixel electrode and the common electrode line decreases, and the storage capacitor increases. The increased storage capacitor can improve the charge capacity of TFT-LCD as well as the image retention effect. Also, the increased storage capacitor can reduce ΔVP and thereby reduce the occurrence of flicker.

An embodiment of the disclosed technology further provides a liquid crystal display comprising a display panel, wherein the display panel comprises a color filter substrate and the array substrate provided by any of the embodiments of the disclosed technology which are bonded with each other.

The methods for manufacturing the array substrate provided by the embodiments of the disclosed technology are simply, and the production cost can be effectively reduced.

The disclosed technology being thus described, it will be obvious that the same may be varied in many ways. Such variations are not to be regarded as a departure from the spirit and scope of the disclosed technology, and all such modifications as would be obvious to those skilled in the art are intended to be comprised within the scope of the following claims.

What is claimed is:

1. A method for manufacturing an array substrate, comprising: forming a gate line, a gate electrode, a data line, an active layer with a channel, a source electrode, a drain electrode, a pixel electrode and an active layer with a channel on a base substrate, wherein the procedure for forming the data line, the active layer with the channel, the source electrode, the drain electrode and the pixel electrode comprising:

forming an active layer thin film and a data line metal thin film;

applying a photoresist on the data line metal thin film and performing exposure and development processes by using a multi-tone mask so as to form a photoresist pattern including a third thickness region, a second thickness region and a first thickness region whose thicknesses are successively increased, the third thickness region at least corresponding to the pixel electrode, the second thickness region corresponding to the data line, the active layer, the source electrode and the drain electrode;

etching the data line metal thin film and the active layer thin film corresponding to the third thickness region;

ashing and removing parts of the thickness of the photoresist so that the photoresist in the second thickness region is totally removed and the photoresist in the first thickness region at least partly remains;

forming a transparent conductive thin film on the base substrate with a remaining photoresist in the first thickness region thereon;

lifting off the remaining photoresist and the transparent conductive thin film formed thereon;

etching the exposed data line metal thin film and etching parts of the subsequently exposed active layer thin film; and etching the remaining and exposed active layer thin film other than the channel by a patterning process so as to form the data line, the source electrode, the drain electrode, the pixel electrode and the active layer with the channel.

2. The method for manufacturing the array substrate according to claim 1, wherein before the forming the active layer thin film and the data line metal thin film, the gate lines and the gate electrode formed by the following steps:

forming a gate metal thin film on the base substrate; and etching the gate metal thin film by a patterning process with a single tone mask to form the gate electrode and the gate line;

forming a gate insulation layer on the base substrate on which the gate electrodes and the gate lines are formed.

3. The method for manufacturing the array substrate according to claim 1, wherein the gate line and the gate electrode are formed before forming the data line; a gate line interface via hole and a data line interface via hole are formed simultaneously with the formation of the data line, the active layer, the source electrode, the drain electrode, the pixel electrode and the active layer with the channel, the procedure of forming the data line, the active layer with the channel, the source electrode, the drain electrode, the pixel electrode, the gate line interface via hole and the data line interface via hole comprises:

forming an active layer thin film and a data line metal thin film;

applying a photoresist on the data line metal thin film and performing exposure and development processes by using a three-tone mask so as to form a photoresist pattern including a fourth thickness region, a third thickness region, a second thickness region and a first thickness region whose thicknesses are successively increased, the fourth thickness region corresponding to the gate line interface via hole, the third thickness region corresponding to the pixel electrode, the second thickness region corresponding to the data line, the active layer, the source electrode, the drain electrode and the data line interface via hole;

performing a first etching process to etch the data line metal thin film, the active layer thin film and a gate insulation layer corresponding to the fourth thickness regions to form the gate line interface via holes;

performing a first ashing process to remove parts of the photoresist according to the thickness of the photoresist in the third thickness region;

performing a second etching process to etch the data line metal thin film and the active layer thin film corresponding to the third thickness region;

performing a second ashing process to remove parts of the photoresist according to the thickness of a remaining photoresist in the second thickness region;

forming a transparent conductive thin film on the base substrate with a remaining photoresist in the first thickness region thereon;

lifting off the remaining photoresist and the transparent conductive thin film formed thereon;

etching the exposed data line metal thin film and etching parts of the subsequently exposed active layer thin film; and etching the remaining and exposed active layer thin film other than the channel by a patterning process so as to form the data line, the source electrode, the drain electrode, the pixel electrode, the active layer with the channel and the data line interface via hole.

4. The method for manufacturing the array substrate according to claim 2, wherein the gate line and the gate electrode are formed before forming the data line; a gate line interface via hole and a data line interface via hole are formed simultaneously with the formation of the data line, the active layer, the source electrode, the drain electrode, the pixel electrode and the active layer with the channel, the procedure of forming the data line, the active layer with the channel, the source electrode, the drain electrode, the pixel electrode, the gate line interface via hole and the data line interface via hole comprises:

forming an active layer thin film and a data line metal thin film;

applying a photoresist on the data line metal thin film and performing exposure and development processes by using a three-tone mask so as to form a photoresist pattern including a fourth thickness region, a third thickness region, a second thickness region and a first thickness region whose thicknesses are successively increased, the fourth thickness region corresponding to the gate line interface via hole, the third thickness region corresponding to the pixel electrode, the second thickness region corresponding to the data line, the active layer, the source electrode, the drain electrode and the data line interface via hole;

performing a first etching process to etch the data line metal thin film, the active layer thin film and a gate insulation layer corresponding to the fourth thickness region to form the gate line interface via hole;

performing a first ashing process to remove parts of the photoresist according to the thickness of the photoresist in the third thickness region;

performing a second etching process to etch the data line metal thin film and the active layer thin film corresponding to the third thickness region;

performing a second ashing process to remove parts of the photoresist according to the thickness of a remaining photoresist in the second thickness region;

forming a transparent conductive thin film on the base substrate with a remaining photoresist in the first thickness region thereon;

lifting off the remaining photoresist and the transparent conductive thin film formed thereon;

etching the exposed data line metal thin film and etching parts of the subsequently exposed active layer thin film; and etching the remaining and exposed active layer thin film other than the channel by a patterning process so as to form the data line, the source electrode, the drain electrode, the pixel electrode, the active layer with the channel and the data line interface via hole.

5. The method for manufacturing the array substrate according to claim 1, wherein the procedure of etching the remaining and exposed active layer thin film other than the channel by the patterning process comprises:

forming a passivation layer on the base substrate with structures thus formed thereon; and etching the passivation layer and the remaining active layer thin film by a patterning process with a single tone mask to form a channel protective layer above the channel.

6. The method for manufacturing the array substrate according to claim 2, wherein the procedure of etching the remaining and exposed active layer thin film other than the channel by the patterning process comprises:
forming a passivation layer on the base substrate with structures thus formed thereon; and
etching the passivation layer and the remaining active layer thin film by a patterning process with a single tone mask to form a channel protective layer above the channel.

7. The method for manufacturing the array substrate according to claim 5, wherein the active layer thin film comprises a semiconductor layer thin film and a doped semiconductor layer thin film, the doped semiconductor layer thin film is etched when the channel is formed, and the exposed semiconductor layer thin film is etched simultaneously with the etching of the passivation layer.

8. The method for manufacturing the array substrate according to claim 6, wherein the active layer thin film comprises a semiconductor layer thin film and a doped semiconductor layer thin film, the doped semiconductor layer thin film is etched when the channel is formed, and the exposed semiconductor layer thin film is etched simultaneously with the etching of the passivation layer.

9. The method for manufacturing the array substrate according to claim 5, wherein the procedure of etching the passivation layer and the remaining active layer thin film by the patterning process with a single tone mask so as to form a channel protective layer above the channel comprises:
applying a photoresist on the passivation layer;
exposing and developing the photoresist with a single tone mask to form a photoresist pattern including a totally reserved region and a totally removed region;
etching the passivation layer and the remaining active layer thin film corresponding to the totally removed region to form the channel protective layer above the channel; and
ashing and removing the remaining photoresist.

10. The method for manufacturing the array substrate according to claim 6, wherein the procedure of etching the passivation layer and the remaining active layer thin film by the patterning process with a single tone mask so as to form a channel protective layer above the channel comprises:
applying a photoresist on the passivation layer;
exposing and developing the photoresist with a single tone mask to form a photoresist pattern including a totally reserved region and a totally removed region;
etching the passivation layer and the remaining active layer thin film corresponding to the totally removed region to form the channel protective layer above the channel; and
ashing and removing the remaining photoresist.

11. The method for manufacturing an array substrate according to claim 5, wherein the procedure of etching the passivation layer and the remaining active layer thin film by the patterning process with a single tone mask so as to form a channel protective layer above the channel comprises:
applying a photoresist on the passivation layer;
exposing and developing the photoresist with a single tone mask to form a photoresist pattern including a totally reserved region and a totally removed region;
etching the passivation layer corresponding to the totally removed region to form the channel protective layer above the channel;
ashing and removing the remaining photoresist; and
etching the exposed remaining active layer thin film.

12. The method for manufacturing the array substrate according to claim 6, wherein the procedure of etching the passivation layer and the remaining active layer thin film by a patterning process with a single tone mask so as to form a channel protective layer above the channel comprises:
applying a photoresist on the passivation layer;
exposing and developing the photoresist with a single tone mask to form a photoresist pattern including a totally reserved region and a totally removed region;
etching the passivation layer corresponding to the totally removed region to form the channel protective layer above the channel;
ashing and removing the remaining photoresist; and
etching the exposed remaining active layer thin film.

13. The method for manufacturing an array substrate according to claim 3, wherein
the thickness of the photoresist for etching the data line metal thin film, the active layer thin film and the gate insulation layer is 30000 to 40000 Å, and the thickness of the photoresist in the second thickness region is 11000 to 17000 Å, the thickness of the photoresist in the third thickness region is 1000 to 7000 Å;
the thickness of the photoresist removed by the first ashing process is 5000 to 10000 Å;
the thickness of the photoresist removed by the second ashing process is 5000 to 10000 Å.

14. The method for manufacturing the array substrate according to claim 4, wherein
the thickness of the photoresist for etching the data line metal thin film, the active layer thin film and the gate insulation layer is 30000 to 40000 Å, and the thickness of the photoresist in the second thickness region is 11000 to 17000 Å, the thickness of the photoresist in the third thickness region is 1000 to 7000 Å;
the thickness of the photoresist removed by the first ashing process is 5000 to 10000 Å;
the thickness of the photoresist removed by the second ashing process is 5000 to 10000 Å.

15. The method for manufacturing the array substrate according to claim 1, wherein the gate line and the gate electrode are formed before forming the data line, a gate line interface via hole and a data line interface via hole are formed simultaneously with the formation of the data line, the active layer, the source electrode, the drain electrode, the pixel electrode and the active layer with the channel, the procedure of forming the data line, the active layer with the channel, the source electrode, the drain electrode, the pixel electrode, the gate line interface via hole and the data line interface via hole comprises:
forming an active layer thin film and a data line metal thin film;
applying a photoresist on the data line metal thin film and performing exposure and development processes by using a three-tone mask so as to form a photoresist pattern including a fourth thickness region, a third thickness region, a second thickness region and a first thickness region whose thicknesses are successively increased, the fourth thickness region corresponding to the gate line interface via hole, the third thickness region corresponding to the pixel electrode, the second thickness region corresponding to the data line, the active layer, the source electrode, the drain electrode and the data line interface via hole;
performing a first etching process to etch the data line metal thin film, the active layer thin film and parts of a gate insulation layer corresponding to the fourth thickness region to form the gate line interface via hole with parts of the gate insulation layer remained;
performing a first ashing process to remove parts of the photoresist according to the thickness of the photoresist in the third thickness region;
performing a second etching process to etch the data line metal thin film and the active layer thin film corresponding to the third thickness region and the remaining gate insulation layer corresponding to the fourth thickness region;

performing a second ashing process to remove parts of the photoresist according to the thickness of a remaining photoresist in the second thickness region;

forming a transparent conductive thin film on the base substrate with a remaining photoresist in the first thickness region thereon;

lifting off the remaining photoresist and the transparent conductive thin film formed thereon;

etching the exposed data line metal thin film and etching parts of the subsequently exposed active layer thin film; and etching the remaining and exposed active layer thin film other than the channel by a patterning process so as to form the data line, the source electrode, the drain electrode, the pixel electrode, the active layer with the channel and the data line interface via hole.

16. The method for manufacturing the array substrate according to claim 2, wherein a gate line interface via hole and a data line interface via hole are formed simultaneously with the formation of the data line, the active layer, the source electrode, the drain electrode, the pixel electrode and the active layer with the channel, the procedure of forming the data line, the active layer with the channel, the source electrode, the drain electrode, the pixel electrode, the gate line interface via hole and the data line interface via hole comprises:

forming an active layer thin film and a data line metal thin film;

applying a photoresist on the data line metal thin film and performing exposure and development by using a three-tone mask so as to form a photoresist pattern including a fourth thickness region, a third thickness region, a second thickness region and a first thickness region whose thicknesses are successively increased, the fourth thickness region corresponding to the gate line interface via hole, the third thickness region corresponding to the pixel electrode, the second thickness region corresponding to the data line, the active layer, the source electrode, the drain electrode and the data line interface via hole;

performing a first etching process to etch the data line metal thin film, the active layer thin film and parts of a gate insulation layer corresponding to the fourth thickness region to form the gate line interface via hole with parts of the gate insulation layer remained;

performing a first ashing process to remove parts of the photoresist according to the thickness of the photoresist in the third thickness region;

performing a second etching process to etch the data line metal thin film and the active layer thin film corresponding to the third thickness region and the remaining gate insulation layer corresponding to the fourth thickness region;

performing a second ashing process to remove parts of the photoresist according to the thickness of a remaining photoresist in the second thickness region;

forming a transparent conductive thin film on the base substrate with a remaining photoresist in the first thickness region thereon;

lifting off the remaining photoresist and the transparent conductive thin film formed thereon;

etching the exposed data line metal thin film and etching parts of the subsequently exposed active layer thin film; and etching the remaining and exposed active layer thin film other than the channel by a patterning process so as to form the data line, the source electrode, the drain electrode, the pixel electrode, the active layer with the channel and the data line interface via hole.

* * * * *